United States Patent
Mischke et al.

(10) Patent No.: US 11,056,441 B2
(45) Date of Patent: Jul. 6, 2021

(54) ELECTROMAGNETIC SHIELDING OF COMPACT ELECTRONIC MODULES

(71) Applicant: Apple Inc., Cupertino, CA (US)

(72) Inventors: Colleen F. Mischke, Sunnyvale, CA (US); Kayo Yanagisawa, Mountain View, CA (US); Yazan Z. Alnahhas, Mountain View, CA (US)

(73) Assignee: APPLE INC., Cupertino, CA (US)

( * ) Notice: Subject to any disclaimer, the term of this patent is extended or adjusted under 35 U.S.C. 154(b) by 0 days.

(21) Appl. No.: 16/703,911

(22) Filed: Dec. 5, 2019

(65) Prior Publication Data
US 2021/0175180 A1    Jun. 10, 2021

(51) Int. Cl.
| H01L 23/552 | (2006.01) |
| H01L 33/48 | (2010.01) |
| H01L 25/16 | (2006.01) |
| H01L 33/58 | (2010.01) |

(52) U.S. Cl.
CPC .......... *H01L 23/552* (2013.01); *H01L 25/167* (2013.01); *H01L 33/483* (2013.01); *H01L 33/58* (2013.01); *H01L 2933/0033* (2013.01)

(58) Field of Classification Search
CPC ............................ H01L 23/552; H01L 25/167
See application file for complete search history.

(56) References Cited

U.S. PATENT DOCUMENTS

| 5,196,230 | A  | 3/1993  | Okonogi et al. |
| 5,704,117 | A  | 1/1998  | Mok et al. |
| 6,218,610 | B1 | 4/2001  | Suzuki |
| 6,271,465 | B1 | 8/2001  | Lacey |
| 6,377,475 | B1 | 4/2002  | Reis |
| 6,866,908 | B2 | 3/2005  | Lichtenstein et al. |
| 7,196,275 | B2 | 3/2007  | Babb et al. |
| 7,214,889 | B2 | 5/2007  | Mazurkiewicz |
| 7,259,969 | B2 | 8/2007  | Zarganis et al. |
| 7,448,901 | B2 | 11/2008 | Weber et al. |
| 7,609,530 | B2 | 10/2009 | Snider |
| 8,004,860 | B2 | 8/2011  | Salzman |

(Continued)

FOREIGN PATENT DOCUMENTS

WO    2005029937 A1    3/2005

OTHER PUBLICATIONS

Kriman et al., U.S. Appl. No. 16/554,651, filed Aug. 29, 2019.

*Primary Examiner* — Jay C Chang
*Assistant Examiner* — Mikka Liu
(74) *Attorney, Agent, or Firm* — Kligler & Associates Patent Attorneys Ltd

(57) ABSTRACT

An electronic module includes a circuit substrate including conductive pads interconnected by traces, including a ground pad for connection to an electrical ground. One or more electronic components are mounted on the circuit substrate. A housing including a dielectric material is mounted on the circuit substrate so as to cover the one or more electronic components. A metal lead, which has first and second ends, is embedded in the dielectric material such that the first end contacts the ground pad on the circuit substrate when the housing is mounted on the circuit substrate, and the second end is exposed at an outer surface of the dielectric material. A conductive coating is disposed over the outer surface of the housing in galvanic contact with the exposed second end of the metal lead.

20 Claims, 3 Drawing Sheets

(56) References Cited

U.S. PATENT DOCUMENTS

| | | |
|---|---|---|
| 10,080,317 B2 | 9/2018 | Toleno et al. |
| 10,383,265 B2 | 8/2019 | Lin et al. |
| 2009/0152688 A1* | 6/2009 | Do .................. H01L 23/552 257/659 |
| 2009/0280311 A1* | 11/2009 | Kumazawa ............. C08L 77/00 428/220 |
| 2010/0109103 A1* | 5/2010 | Tsao .................. B81B 7/0064 257/418 |
| 2018/0007818 A1 | 1/2018 | Toleno et al. |

* cited by examiner

ELECTROMAGNETIC SHIELDING OF COMPACT ELECTRONIC MODULES

FIELD OF THE INVENTION

The present invention relates generally to electronic devices, and particularly to means and methods for shielding electronic modules against electromagnetic interference.

BACKGROUND

The term "electronic module" is used herein to refer to a self-contained unit, comprising a circuit substrate and electronic components mounted on the substrate, which may be assembled into a larger and more complex device. The substrate may comprise, for example, a polymer, ceramic, or semiconductor substrate, with conductive pads and traces for connection to the electronic components on the substrate. The electronic components may comprise any of a range of passive and active components, including integrated circuit chips. In electronic modules designed for optoelectronic applications, the electronic components may include, for example, optical emitters and/or detectors, and the module may also comprise optical components, such as lenses, windows and optical filters.

The components in many electronic modules are sensitive to electromagnetic interference (EMI) from other modules and components in their vicinity, and may likewise emit electromagnetic fields that can interfere with other modules and components. To mitigate such interference, electronic modules are often enclosed in a shielded case, which is typically constructed from or coated with a conductor, such as a suitable metal sheet or layer. The conductive shield is connected to an electrical ground in order to attenuate the penetration of electromagnetic fields through the case.

SUMMARY

Embodiments of the present invention that are described hereinbelow provide improved methods and means for electromagnetic shielding, as well as electronic modules implementing such methods and means.

There is therefore provided, in accordance with an embodiment of the invention, an electronic module, including a circuit substrate, which includes conductive pads interconnected by traces, including a ground pad for connection to an electrical ground. One or more electronic components are mounted on the circuit substrate. A housing, including a dielectric material, is mounted on the circuit substrate so as to cover the one or more electronic components. A metal lead, which has first and second ends, is embedded in the dielectric material such that the first end contacts the ground pad on the circuit substrate when the housing is mounted on the circuit substrate, and the second end is exposed at an outer surface of the dielectric material. A conductive coating is disposed over the outer surface of the housing in galvanic contact with the exposed second end of the metal lead.

In a disclosed embodiment, the conductive coating is formed by deposition of a metal vapor on the dielectric material, thereby forming the galvanic contact with the exposed end of the metal lead.

In some embodiments, the metal lead includes a sheet of metal, which is molded into the dielectric material, which may include a molded plastic material. Additionally or alternatively, the first end of the metal lead is exposed at a lower edge of the housing, which adjoins the circuit substrate when the housing is mounted on the circuit substrate.

In a disclosed embodiment, a part of the housing has a concave topology, and the conductive coating covers the part of the housing having the concave topology. Additionally or alternatively, the housing contains an optical window, and the conductive coating covers all of the housing other than the optical window. Further additionally or alternatively, the module includes a metal trace disposed on an inner surface of the housing and configured to contact one or more of the conductive pads on the circuit substrate when the housing is mounted on the circuit substrate.

There is also provided, in accordance with an embodiment of the invention, a method for producing an electronic module. The method includes mounting one or more electronic components on a circuit substrate including conductive pads and traces, including a ground pad for connection to an electrical ground. A housing is formed from a dielectric material, while embedding a metal lead, which has first and second ends, in the dielectric material such that the second end is exposed at an outer surface of the dielectric material. A conductive coating is deposited over the outer surface of the housing in galvanic contact with the exposed second end of the metal lead. The housing is mounted on the circuit substrate so that the housing covers the one or more electronic components, and the first end of the metal lead contacts the ground pad on the circuit substrate.

The present invention will be more fully understood from the following detailed description of the embodiments thereof, taken together with the drawings in which:

DETAILED DESCRIPTION OF EMBODIMENTS

The need for electromagnetic shielding of electronic modules can add substantially to their cost, size and complexity. Provision must be made not only to place a conductive cover over the module, but also to make electrical contact between the cover and an electrical ground on the circuit substrate. When the geometry of the module is complex, it may be too difficult and costly to form a conductive shield over the entire module, with the result that gaps are left in the shield, through which electromagnetic interference can leak.

Embodiments of the present invention address these problems by enclosing the electronic module in a housing made from a dielectric material, such as a molded plastic, and coating the outer surface of the housing with a conductive layer, for example by processes of vapor deposition that are known in the art. Such coating processes can form a layer over the entire surface of the housing that is thick enough to shield against high-frequency EMI for many applications. To enable the conductive coating to be connected to ground, a metal lead is embedded in the dielectric material, for example as part of the process of plastic molding that is used to make the housing. The metal lead is embedded in a position in which one end is exposed at the outer surface of the dielectric material, and will thus form a galvanic contact with the conductive coating during the process of deposition; while the other end of the metal lead will contact a ground pad on the circuit substrate of the module when the housing is mounted and fixed in place over the substrate.

Using this approach, an electronic module can be shielded against EMI with little or no increase in size relative to an unshielded version of the same module, particularly since the conductive coating on the housing is connected to the ground through the housing itself, rather than externally. The metal lead that is embedded into the dielectric material of the housing for the purpose of making the ground connection can also be designed to stabilize and strengthen the housing itself. The deposition process that is used to deposit the conductive coating on the outer surface of the housing can readily accommodate complex shapes, including concave topologies, thus enabling the module to be shielded completely. When it is necessary to leave an aperture in the housing, for example to accommodate an optical window, the conductive coating can still cover all the rest of the housing, leaving only the aperture itself without shielding.

Figure 1A:
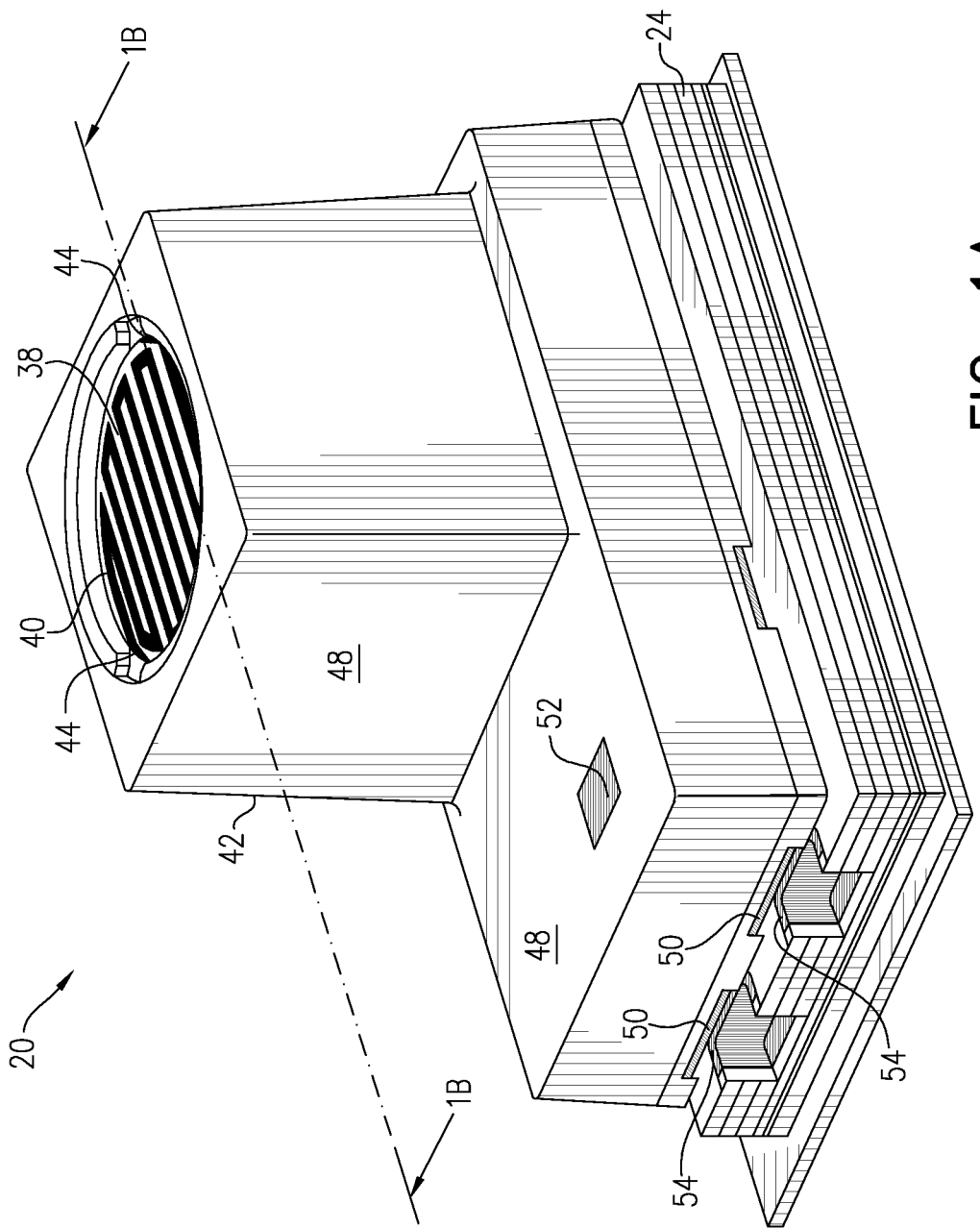
FIG. 1A is a schematic, pictorial view of a shielded electronic module, in accordance with an embodiment of the invention.
Figure 1B:
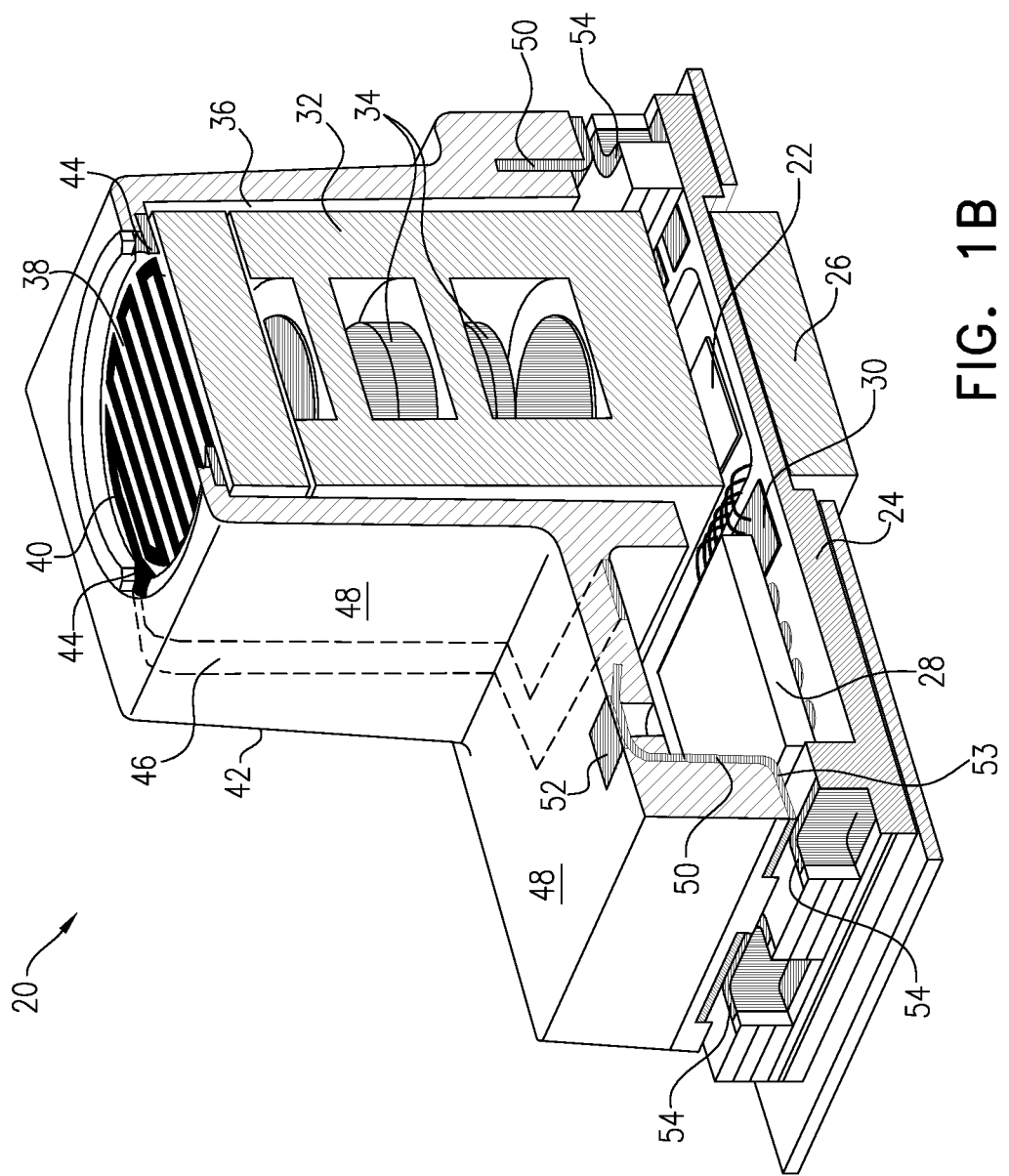
FIG. 1B is a cutaway pictorial view of the module of FIG. 1A.
Figure 2:
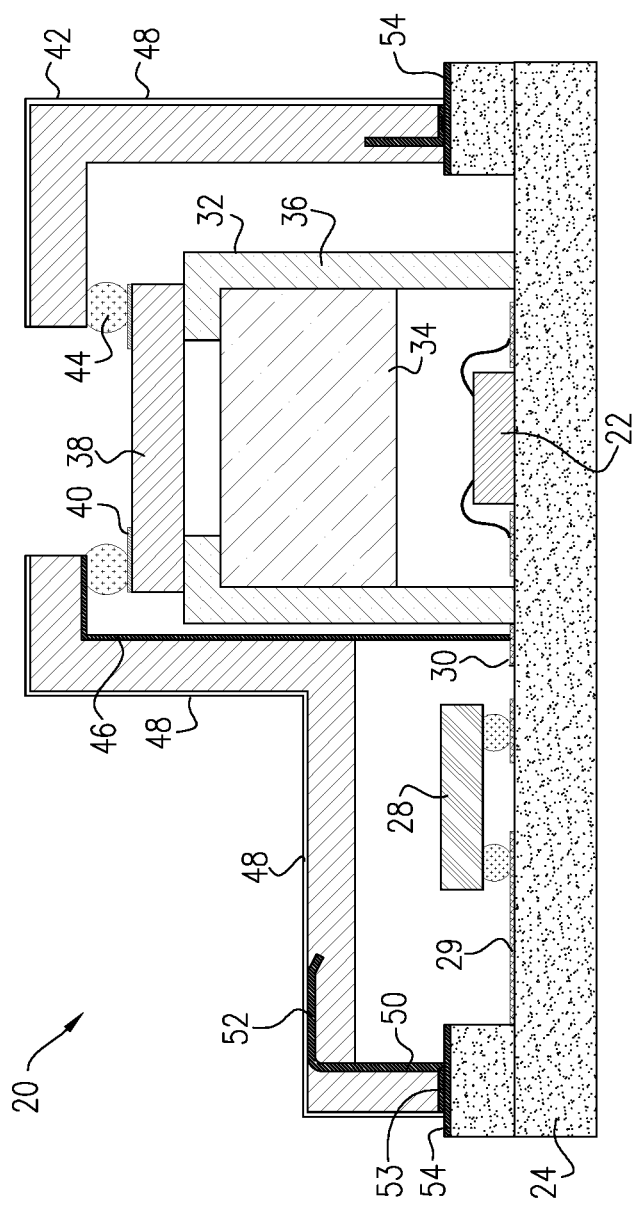
FIG. 2 is a schematic sectional view of a shielded electronic module, in accordance with an embodiment of the invention.

Reference is now made to FIGS. 1A, 1B and 2, which schematically illustrate a shielded electronic module 20, in accordance with an embodiment of the invention. FIG. 1A is a pictorial, external view, while FIG. 1B is a cutaway view showing internal details of the module, and FIG. 2 is a simplified sectional view. In the present example, module 20 operates as a projector of optical radiation; but the principles of this embodiment may similarly be applied, mutatis mutandis, to electronic modules of other sorts. Module 20 is typically installed, together with other modules, in an electronic device (not shown), which provides electrical power and ground connections, as well as control inputs to and data outputs from the module.

Module 20 comprises an optical emitter chip 22 (comprising a laser diode or light-emitting diode, or a monolithic array of such emitters, for example), which is mounted on a circuit substrate 24, such as a multi-layer ceramic or polymer circuit board. (In the pictured example, emitter chip 22 is mounted over a heat sink 26.) Additional electronic components, such as a controller chip 28, which drives emitter chip 22, are also mounted on substrate 24. Substrate 24 comprises conductive pads 30 interconnected by circuit traces 29, including ground pads 54 for connection to an electrical ground.

For purposes of optical projection, module 20 comprises a lens assembly 32, which is mounted over emitter chip 22. Lens assembly 32 comprises multiple lenses 34 mounted in a lens barrel 36, terminating in an optical window 38 at the outer end of the lens assembly. Assuming module 20 is to project patterned radiation, window 38 may comprise a diffractive optical element (DOE), which is designed to imposed the desired pattern on the radiation that is output by chip 22. In the pictured example, a transparent conductive trace 40 is disposed over the surface of window 38. Controller chip 28 measures the resistance of trace 40 in order to ensure that window 38 is intact, and inhibits the operation of emitter chip 22 upon detecting a change in resistance that may occur if window 38 is compromised. Further details of this control functionality are described, for example, in U.S. patent application Ser. No. 16/554,651, filed Aug. 29, 2019, and are beyond the scope of the present description.

Module 20 is covered by a housing 42 comprising a dielectric material, such as a molded plastic, which is mounted on circuit substrate 24 so as to cover and protect emitter chip 22 and controller chip 28, as well as the other components and traces on the substrate. Housing 42 has an aperture over window 38, through which optical radiation from emitter chip 22 is projected. In the present example, contact pads 44 around the aperture in housing 42 connect the ends of trace 40 on window 38 to one or more metal traces 46, which are disposed on the inner surface of the housing. Traces 46 may comprise, for example, metal leads that are embedded in housing 42 during the molding process or metal traces that are plated onto the inner surface of housing 42 after molding. Metal traces 46 contact respective conductive pads 30 on circuit substrate 24 when housing 42 is mounted on the circuit substrate, and thus convey signals to and from controller chip 28, for example.

To shield module 20 against EMI, a metal lead 50 is embedded in the dielectric material of housing 42, for example by molding a small piece of a metal sheet into the plastic body of the housing. An outer end 52 of lead 50 is positioned at the outer surface of the housing and is thus exposed during the molding process. A conductive coating 48 is then formed over the outer surface of the housing, and thus makes a galvanic contact with the exposed outer end 52 of metal lead 50.

Coating 48 can be formed, for example, by deposition of a metal vapor on the outer surface of housing 42, using physical vapor deposition (PVD) techniques that are known in the art, such as sputtering or evaporation. As one example, coating 48 may comprise a chromium-zinc alloy, with a thickness between 2 and 10 µm. Alternatively, other sorts of coating materials and thicknesses may be used, depending on application requirements. Due to the need to cover the protruding lens assembly 32, housing 42 has a concave topology, but the PVD process is able to cover the entire outer surface of the housing—including the concave portions—with coating 48. The area of the aperture around window 38 can be masked during the PVD process so that this area is not covered by coating 48, and contact pads 44 are not grounded.

An inner end 53 of lead 50 is exposed at the lower edge of housing 42, which adjoins circuit substrate 24 when the housing is mounted on the substrate. Inner end 53 contacts a ground pad 54 on circuit substrate 24, so that conductive coating 48 is grounded through lead 50 to the ground of the device in which module 20 is installed. Inner end 53 may be connected to ground pad 54 by a solder bond or conductive epoxy, for example. Once the connection is made, and coating 48 is grounded, the coating will shield against both external interference entering module 20 (leading to noise pickup on traces 46, for example) and against electromagnetic emission from module 20, for example due to the high-frequency signals driving emitter chip 22.

In the pictured example, for enhanced mechanical and electrical protection of module 20, substrate 24 comprises multiple ground pads 54 on castellations that protrude around the edges of the substrate, and housing 42 rests on these castellations. Alternatively, however, ground pads 54 may be flush with the surface of substrate 24 on which chips 22 and 28 are mounted.

The figures and description above relate, for the sake of concreteness and clarity, to a particular sort of module configuration and geometry. The principles of the present invention, however, are by no means limited to this particular module and can similarly be applied to electronic modules of other types and shapes.

It will thus be appreciated that the embodiments described above are cited by way of example, and that the present invention is not limited to what has been particularly shown and described hereinabove. Rather, the scope of the present invention includes both combinations and subcombinations of the various features described hereinabove, as well as variations and modifications thereof which would occur to persons skilled in the art upon reading the foregoing description and which are not disclosed in the prior art.

The invention claimed is:

1. An electronic module, comprising:
   a circuit substrate comprising conductive pads interconnected by traces, including a ground pad for connection to an electrical ground;
   one or more electronic components mounted on the circuit substrate;
   a housing comprising a dielectric material, which is mounted on the circuit substrate so as to cover the one or more electronic components;
   a metal lead, which has first and second ends and is embedded in the dielectric material such that the first end is exposed at a lower edge of the housing, which adjoins the circuit substrate when the housing is mounted on the circuit substrate, and contacts the ground pad on the circuit substrate when the housing is mounted on the circuit substrate, and the second end is exposed at an outer surface of the dielectric material; and
   a conductive coating disposed over the outer surface of the dielectric material in galvanic contact with the exposed second end of the metal lead.

2. The module according to claim 1, wherein the conductive coating is formed by deposition of a metal vapor on the dielectric material, thereby forming the galvanic contact with the exposed end of the metal lead.

3. The module according to claim 1, wherein the metal lead comprises a sheet of metal, which is molded into the dielectric material.

4. The module according to claim 3, wherein the dielectric material comprises a molded plastic material.

5. The module according to claim 1, wherein a part of the housing has a concave topology, and the conductive coating covers the part of the housing having the concave topology.

6. The module according to claim 1, wherein the housing contains an optical window, and the conductive coating covers all of the housing other than the optical window.

7. The module according to claim 1, and comprising a metal trace disposed on an inner surface of the housing and configured to contact one or more of the conductive pads on the circuit substrate when the housing is mounted on the circuit substrate.

8. A method for producing an electronic module, the method comprising:
   mounting one or more electronic components on a circuit substrate comprising conductive pads and traces, including a ground pad for connection to an electrical ground;
   forming a housing from a dielectric material, while embedding a metal lead, which has first and second ends, in the dielectric material such that the first end is exposed at a lower edge of the housing, which adjoins the circuit substrate when the housing is mounted on the circuit substrate, and the second end is exposed at an outer surface of the dielectric material;
   depositing a conductive coating over the outer surface of the dielectric material using in galvanic contact with the exposed second end of the metal lead; and
   mounting the housing on the circuit substrate so that the housing covers the one or more electronic components, and the first end of the metal lead contacts the ground pad on the circuit substrate.

9. The method according to claim 8, wherein depositing the conductive coating comprises depositing a metal vapor on the dielectric material, thereby forming the galvanic contact with the exposed end of the metal lead.

10. The method according to claim 8, wherein embedding the metal lead comprises molding a sheet of metal into the dielectric material.

11. The method according to claim 10, wherein forming the housing comprises molding a plastic material to form the housing, containing the sheet of metal.

12. The method according to claim 8, wherein a part of the housing has a concave topology, and wherein depositing the conductive coating comprises covering the part of the housing having the concave topology with the conductive coating.

13. The method according to claim 8, wherein the housing contains an optical window, and the conductive coating covers all of the housing other than the optical window.

14. The method according to claim 8, and comprising forming a metal trace on an inner surface of the housing so as to contact one or more of the conductive pads on the circuit substrate when the housing is mounted on the circuit substrate.

15. An electronic module, comprising:
   a circuit substrate comprising conductive pads interconnected by traces, including a ground pad for connection to an electrical ground;
   one or more electronic components mounted on the circuit substrate;
   a housing comprising a dielectric material, which is mounted on the circuit substrate so as to cover the one or more electronic components, wherein the housing contains an optical window;
   a metal lead, which has first and second ends and is embedded in the dielectric material such that the first end contacts the ground pad on the circuit substrate when the housing is mounted on the circuit substrate, and the second end is exposed at an outer surface of the dielectric material; and
   a conductive coating disposed over the outer surface of the dielectric material in galvanic contact with the exposed second end of the metal lead and covering all of the housing other than the optical window.

16. The module according to claim 15, wherein the conductive coating is formed by deposition of a metal vapor on the dielectric material, thereby forming the galvanic contact with the exposed end of the metal lead.

17. The module according to claim 15, wherein the metal lead comprises a sheet of metal, which is molded into the dielectric material.

18. The module according to claim 17, wherein the dielectric material comprises a molded plastic material.

19. The module according to claim 15, wherein a part of the housing has a concave topology, and the conductive coating covers the part of the housing having the concave topology.

20. The module according to claim 15, and comprising a metal trace disposed on an inner surface of the housing and configured to contact one or more of the conductive pads on the circuit substrate when the housing is mounted on the circuit substrate.

* * * * *